United States Patent
Lee et al.

(10) Patent No.: US 7,224,585 B2
(45) Date of Patent: May 29, 2007

(54) LIQUID-COOLED HEAT SINK ASSEMBLY

(75) Inventors: Tsung Lung Lee, Tu-Chen (TW); Dong Wang, Shenzhen (CN); Li He, Shenzhen (CN); ShengHua Wang, Shenzhen (CN); Jian-Hua Gu, Shenzhen (CN); Zhi-Gang Liu, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 278 days.

(21) Appl. No.: 10/900,898

(22) Filed: Jul. 27, 2004

(65) Prior Publication Data

US 2005/0024830 A1    Feb. 3, 2005

(30) Foreign Application Priority Data

Aug. 8, 2003    (TW)    ............... 92121877 A

(51) Int. Cl.
    *H05K 7/20*    (2006.01)
(52) U.S. Cl. .................. 361/699; 361/700; 361/695; 257/714; 165/121
(58) Field of Classification Search ........ 361/687, 361/692, 695–699, 700–710, 712–714; 257/717–722, 257/714–716; 165/104.21, 104.26, 104.33, 165/185, 121–126; 174/15.1, 16.3, 15.2, 174/252; 62/3.7, 259.2, 3.3, 434
See application file for complete search history.

(56) References Cited

U.S. PATENT DOCUMENTS

| | | | |
|---|---|---|---|
| 5,285,347 A | 2/1994 | Fox et al. | |
| 5,737,923 A | 4/1998 | Gilley et al. | |
| 6,336,497 B1 * | 1/2002 | Lin | ............ 165/80.3 |
| 6,343,478 B1 | 2/2002 | Chang | |
| 6,367,542 B1 * | 4/2002 | Chen | ......... 165/80.3 |
| 6,408,630 B2 | 6/2002 | Macias et al. | |
| 6,466,442 B2 * | 10/2002 | Lin | ............ 361/695 |
| 6,538,888 B1 * | 3/2003 | Wei et al. | ............ 361/697 |
| 6,578,626 B1 | 6/2003 | Calaman et al. | |
| 6,580,609 B2 | 6/2003 | Pautsch | |
| 6,708,501 B1 * | 3/2004 | Ghoshal et al. | ............ 62/3.7 |
| 6,789,610 B1 * | 9/2004 | Hegde | ........ 165/104.21 |
| 7,055,581 B1 * | 6/2006 | Roy | ........ 165/104.33 |
| 2001/0050164 A1 * | 12/2001 | Wagner et al. | ......... 165/104.33 |

FOREIGN PATENT DOCUMENTS

CN    99208214    3/2000

* cited by examiner

*Primary Examiner*—Michael Datskovskiy
(74) *Attorney, Agent, or Firm*—Wei Te Chung

(57) ABSTRACT

A liquid-cooled heat sink assembly for cooling down an electronic component includes a main body (20) defining a central chamber (21) therein and having a number of fins (22) on an outside thereof, liquid coolant received in the central chamber, a first fan (40) received in the central chamber, and a second fan (60) positioned over the main body and engaged with the first fan. The heat sink assembly couples forced liquid cooling and forced airflow cooling, and need not extra pipes to form a circuit for the liquid coolant. Thus, not only the volume of the heat sink assembly is lessened, but also facilitates matching with electronic components.

20 Claims, 4 Drawing Sheets

LIQUID-COOLED HEAT SINK ASSEMBLY

BACKGROUND OF THE INVENTION

1. Field of the Invention

The present invention relates to liquid-cooled heat sink assemblies, and more particularly to a liquid-cooled heat sink assembly with a compact structure.

2. Description of Prior Art

Numerous modern electronic devices, such as computers, comprise electronic components mounted on circuit boards. When the electronic device operates, the electronic components can generate much heat. The heat must be removed from the electronic components; otherwise the electronic device may malfunction or even be damaged or destroyed.

Most electronic components are designed to operate over a wide range of temperatures. If the electronic component operates above its threshold operating temperature, it is liable to operate poorly or improperly. For example, the electronic component may operate too slowly, be less tolerant of voltage variations, be less tolerant of electrical "noise," or fail prematurely.

One technique for removing heat is to a employ an air-cooled heat sink across contacts of the electronic component. However, due to the low density of air, the amount of heat that can be removed from the electronic component is limited. These days, electronic components such as integrated circuits incorporate more circuits, operate faster, and generate more heat than previously. The circulating air relied on by air-cooled heat sinks is often not sufficient to remove the heat generated by these modern electronic components, which are liable to exceed their threshold temperatures.

In order to overcome the above-described problems, an alternate means for removing heat employs a liquid which contacts a heat sink that is in contact with the electronic component. Because of their greater densities, moving liquids are capable of removing much greater amounts of heat than moving air. An example of this kind of liquid-cooled heat sink assembly is disclosed in China Patent No. 99,208,214. As shown in FIG. 4, the liquid-cooled heat sink assembly comprises a pump 100, a heat sink 400 defining a chamber therein and a heat exchanger 300 having a cooling wafer 200. A zigzagged passageway 403 is defined in the chamber of the heat sink 400 by a plurality of parallel partitions, for liquid coolant to flow therealong. The pump 100 defines a first inlet 102 and a first outlet 101. The heat exchanger 300 defines a second inlet 302, and a second outlet 301 connecting with the first inlet 102 of the pump 100. A pipe 405 connects an inlet of the heat sink 400 and the first outlet 101 of the pump 100. An outlet of the heat sink 400 is connected to the second inlet 302 of the heat exchanger 300 through another pipe 406. Thus, the heat sink 400, the pump 100 and the heat exchanger 300 together form a circuit for transferring heat from an electronic component to the liquid coolant contained in the circuit and for dissipating the heat at the heat exchanger 300.

However, in the above-described liquid-cooled heat sink assembly, the heat sink 400, the heat exchanger 300 and the pump 100 are separated from each other. This makes the structure of the liquid-cooled heat sink assembly unduly complicated and heavy, and difficult to position among electronic components in a typical electronic device.

Thus, an improved liquid-cooled heat sink which overcomes the above-mentioned problems is desired.

BRIEF SUMMARY OF THE INVENTION

Accordingly, an object of the present invention is to provide a liquid-cooled heat sink assembly which has a compact structure.

Another object of the present invention is to provide a liquid-cooled heat sink assembly which is readily positioned in an electronic device.

To achieve the above-mentioned objects, a liquid-cooled heat sink assembly for cooling down an electronic component in accordance with the present invention comprises a main body defining a central chamber therein and comprising a plurality of first fins on an outside thereof, liquid coolant received in the central chamber, a first fan received in the central chamber, and a second fan positioned over the main body and engaged with the first fan. The liquid-cooled heat sink assembly further comprises a plurality of second fins helically formed on an inside wall of the main body in the chamber. In use of the heat sink assembly, the liquid coolant absorbs heat from the electronic components and transfers the heat to the second fins in the chamber under driving force of the first fan. The heat is subsequently conducted to the first fins of the main body and dissipated from the first fins to the ambient environment. Under driving force of the second fan, air between the first fins is conveyed to the ambient environment. The heat sink assembly couples forced liquid cooling and forced airflow cooling, and needs no pipes whatsoever for circulation of the liquid coolant. Thus, not only is the size of the heat sink assembly reduced, but also positioning of the heat sink assembly among electronic components in an electronic device is simple.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
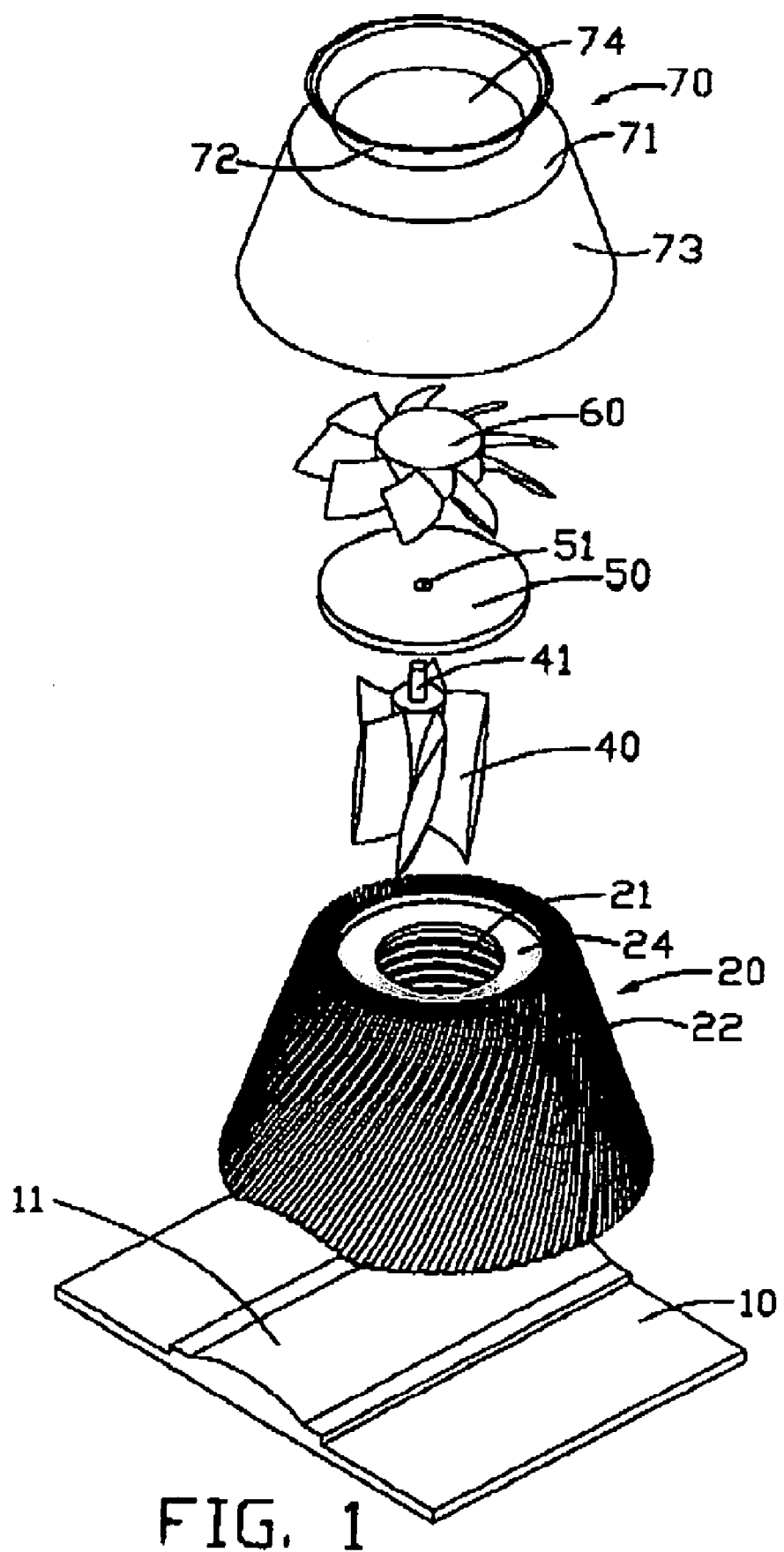
FIG. 1 is an exploded view of a liquid-cooled heat sink assembly in accordance with preferred embodiment of the present invention.
Figure 2:
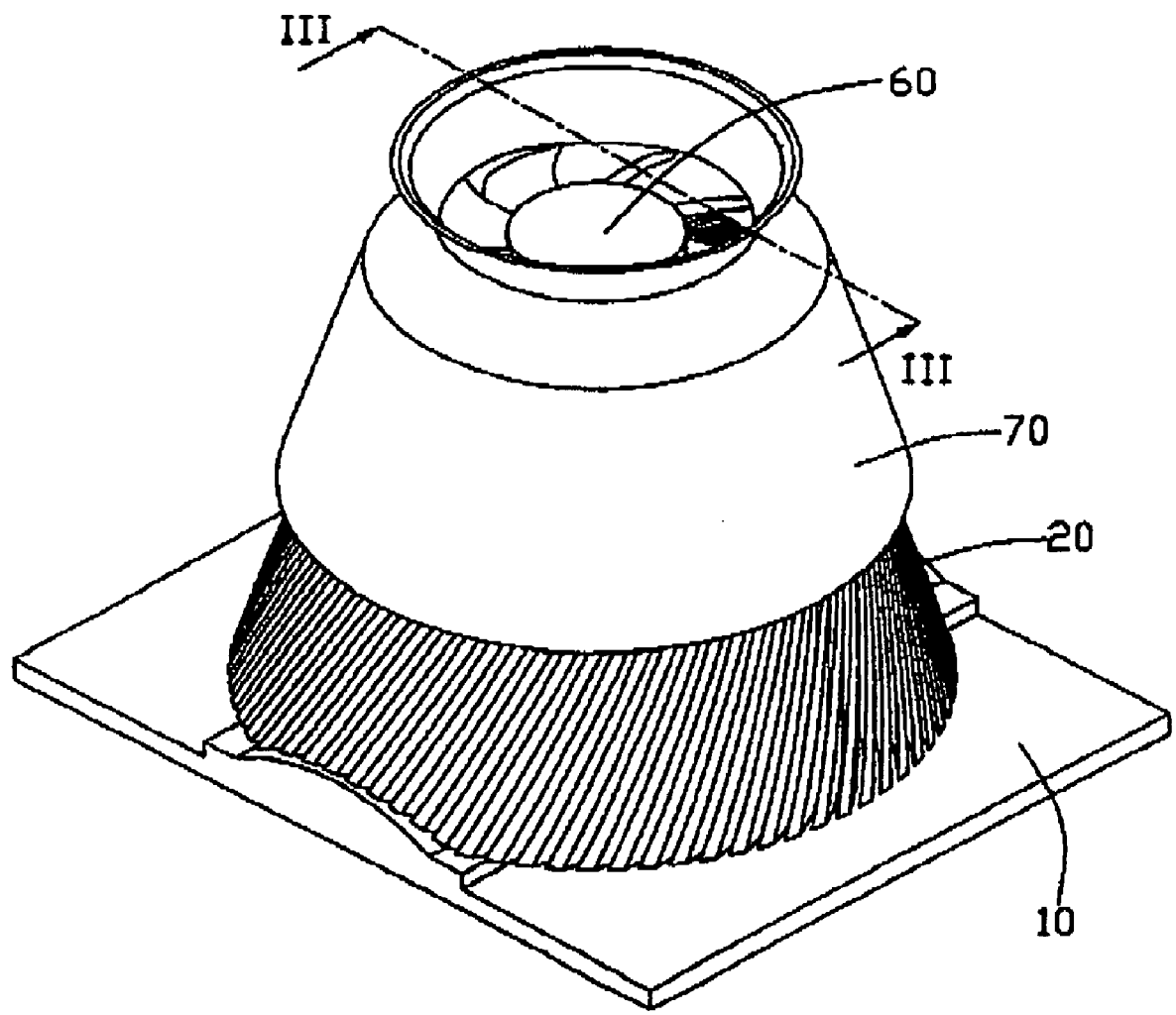
FIG. 2 is an assembled view the liquid-cooled heat sink assembly of FIG. 1.
Figure 3:
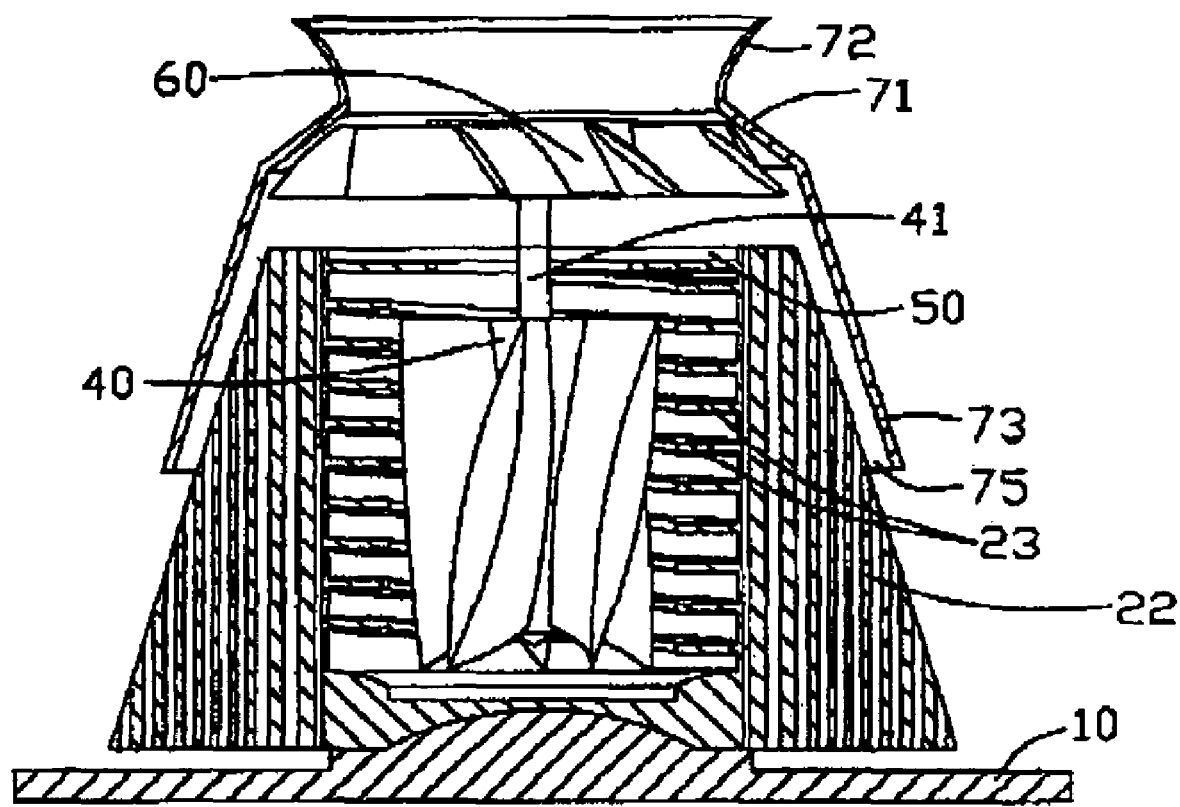
FIG. 3 is a cross-sectional view of the liquid-cooled heat sink assembly taken along line III—III of FIG. 2.
Figure 4:
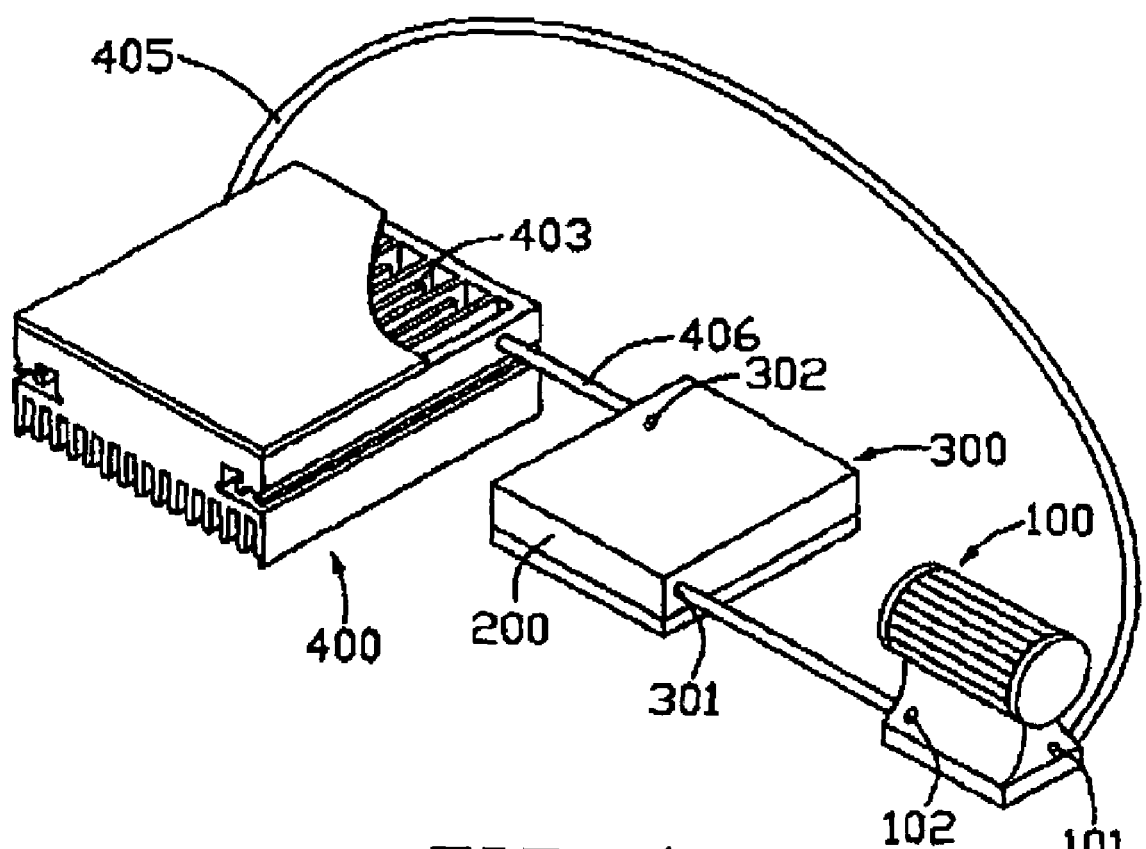
FIG. 4 is an isometric view of a conventional liquid-cooled heat sink assembly.

Referring to FIGS. 1–3, a liquid-cooled heat sink assembly for cooling down an electronic component in accordance with the present invention comprises a base 10, a main body 20, a first fan 40, a second fan 60, a plugging plate 50 and a shell 70.

The base 10 is substantially a flat plate, which is attached onto the electronic component and which supports the main body 20. Generally, heat generated by the electronic component concentrates on a central portion thereof, therefore an arched protrusion 11 is formed on a central portion of the base 10 for promoting efficient heat transfer.

The main body 20 comprises a central, hollow cylindrical core portion (not labeled), and a plurality of curved fins 22 extending radially outwardly from the core portion. The core portion has top and bottom surfaces (not labeled). A central chamber 21 is defined in the core portion, for receiving liquid coolant. The top surface defines a shallow, circular cutout (not labeled) in communication with the central chamber 21. The cutout thus provides a step 24 having a height equal to a thickness of the plugging plate 50. The liquid coolant is added into the central chamber 21 via the cutout. An area of each fin 22 progressively increases from the top surface to the bottom surface of the core portion. Adjacent fins 22 are substantially parallel to each other, such that the fins 22 have a generally spiraled configuration with a central axis at a center of the main body 20. Thus the main body 20 is generally frustum-shaped, and the fins 22 form a plurality of curved air-guide channels for facilitating airflow. A bottom surface of the main body 20 defines a pair of opposite arched concavities (not labeled), for fittingly attaching the main body 20 onto the arched protrusion 11 of the base 10.

A plurality of fins 23 (shown in FIG. 3) is provided on an inside wall of the core portion in the chamber 21 in helical formation, for facilitating transfer of heat to the fins 22 of the main body 20. Alternatively, the plurality of fins 23 can be replaced by a single helical fin. In a further alternative embodiment, the plurality of fins 23 can be arranged parallel to each other.

The first fan 40 is received in the central chamber 21, for agitating the liquid coolant to transfer heat to the inside wall of the core portion. The plugging plate 50 is circular, and has a size substantially equal to a size of the cutout of the core portion. A hole 51 is defined in a middle of the plugging plate 50. The plugging plate 50 is received on the step 24, for sealing the central chamber 21 of the core portion. The second fan 60 is positioned over the main body 20. An axle 41 of the first fan 40 is received through the hole 51 of the plugging plate 50 and engaged with the second fan 60.

The shell 70 is generally frustum-shaped and hollow to conform with the shape of an upper portion of the main body 20. The shell 70 is also slightly larger than said upper portion, for covering said upper portion. The shell 70 comprises an upper portion 72, a lower portion 73, and a neck portion 71 interconnecting the upper and lower portions 72, 73. The upper portion 72 defines an upper opening 74, and the lower portion 73 defines a lower opening 75. A diameter of the lower opening 75 is greater than that of the upper opening 74. A largest diameter of the neck portion 71 is greater than a diameter of the upper opening 74. The neck portion 71 is sized to receive the second fan 60 therein, for forced convection of air through the air-guide channels of the main body 20 from the top surface to the bottom surface. A height of the lower portion 73 is substantially less than that of the main body 20. Accordingly, when the shell 70 is attached on the main body 20, lower portions of the fins 22 are exposed to the ambient environment for dissipation of air from the air-guide channels thereto.

In use of the heat sink assembly, the base 10 is attached onto a surface of the electronic component. The base 10 transfers heat from the electronic component to the liquid coolant in the central chamber 21. The liquid coolant absorbs the heat and transfers the heat to the fins 23 of the chamber 21 under driving force of the first fan 40. The heat is subsequently conducted to the fins 22 of the main body 20. The heat is dissipated from the fins 22 to air in the air-guide channels and also directly to the ambient environment. Under driving force of the second fan 60, air in the air-guide channels is conveyed to the ambient environment. Because the first fan 40 and the second fan 60 are connected to each other, they can be driven by a same single motor. In an alternative embodiment, the first and second fans 40, 60 can be separately fixed to the main body 20 and be driven by separate motors.

In a further alternative embodiment, the first fan 40 can be replaced by other agitating means such as a pug mill, a crutcher or a screw paddle which can suitably agitate the liquid coolant.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A liquid-cooled heat sink assembly comprising:
a main body defining a central chamber therein and having a plurality of fins on an outside thereof;
liquid coolant received in the chamber of the main body;
an agitating means disposed in the chamber; and
a fan positioned over the main body and engaged with the agitating means.

2. The liquid-cooled heat sink assembly as described in claim 1, wherein the agitating mean comprises a fan, a pug mill, a crutcher or a screw paddle.

3. The liquid-cooled heat sink assembly as described in claim 1, further comprising a plurality of fins helically arranged on an inside wall of the main body in the chamber.

4. The liquid-cooled heat sink assembly as described in claim 1, further comprising a helical fin formed on an inside wall of the main body in the chamber.

5. The liquid-cooled heat sink assembly as described in claim 1, wherein the plurality of fins are curved.

6. The liquid-cooled heat sink assembly as described in claim 1, wherein the main body has a top surface and a bottom surface.

7. The liquid-cooled heat sink assembly as described in claim 6, wherein an area of each fin progressively increases from the top surface to the bottom surface of the main body.

8. The liquid-cooled heat sink assembly as described in claim 7, wherein adjacent fins are substantially parallel to each other, and the fins have a generally spiraled configuration with a central axis at a center of the main body.

9. The liquid-cooled heat sink assembly as described in claim 6, wherein the top surface defines a cutout.

10. The liquid-cooled heat sink assembly as described in claim 9, further comprising a sealing means sealing the cutout of the main body.

11. The liquid-cooled heat sink assembly as described in claim 10, wherein the sealing means is a plate defining a hole, and an axle of the agitating means extends through the hole of the plate and engages with the fan.

12. The liquid-cooled heat sink assembly as described in claim 1, further comprising a shell for covering the main body.

13. The liquid-cooled heat sink assembly as described in claim 12, wherein the shell comprises an upper portion, a lower portion and a neck portion interconnecting the upper and lower portions.

14. The liquid-cooled heat sink assembly as described in claim 12, wherein a height of the lower portion is substantially less than that of the main body.

15. A liquid-cooled heat sink assembly comprising: a hollow core portion; liquid coolant received in the core portion; a plurality of fins extending outwardly from an outer wall of the core portion; an agitating means received in the core portion; and an airflow cooling means positioned over the core portion;

wherein the agitating means comprises a fan, a pug mill, a crutcher or a screw paddle.

16. A liquid-cooled heat sink assembly comprising;
a hollow core portion;
liquid coolant received in the core portion;
a plurality of fins extending outwardly from an outer wall of the core portion;
an agitating means received in the core portion;
an airflow cooling means positioned over the core portion; and
a plurality of fins helically arranged on an inside wall of the core portion.

17. The liquid-cooled heat sink assembly as described in claim 16, wherein the airflow cooling means comprises a fan.

18. The liquid-cooled heat sink assembly as claimed in claim 15, further including a metallic shell covering a top section of the core portion, wherein said shell cooperates with the core portion to sandwich the air flow cooling means therebetween.

19. The liquid-cooled heat sink assembly as claimed in claim 18, wherein the core portion is of an upwardly converging configuration, and the shell has a similar configuration to the core portion.

20. The liquid-cooled heat sink assembly as claimed in claim 16, further including a metallic shell covering a top section of the core portion, wherein said shell cooperates with the core portion to sandwich the air flow cooling means therebetween; wherein the core portion is of an upwardly converging configuration, and the shell has a similar configuration to the core portion.

* * * * *